United States Patent [19]
Delperier et al.

[11] Patent Number: 5,652,030
[45] Date of Patent: Jul. 29, 1997

[54] VAPOR PHASE CHEMICAL INFILTRATION PROCESS OF A MATERIAL INTO A POROUS SUBSTRATE AT CONTROLLED SURFACE TEMPERATURE

[75] Inventors: Bernard Delperier, Martignas sur Jalles; Christian Robin-Brosse, Le Haillan; Jean-Luc Domblides, Bruges; Gilles Bondieu, Saint Jean d'Illac, all of France

[73] Assignee: Societe Europeenne de Propulsion, Suresnes, France

[21] Appl. No.: 635,933

[22] PCT Filed: Sep. 20, 1994

[86] PCT No.: PCT/FR94/01090

§ 371 Date: Apr. 25, 1996

§ 102(e) Date: Apr. 25, 1996

[87] PCT Pub. No.: WO95/11868

PCT Pub. Date: May 4, 1995

[30] Foreign Application Priority Data

Oct. 27, 1993 [FR] France .................................. 93 12807

[51] Int. Cl.[6] ...................................................... C23C 8/00
[52] U.S. Cl. ...................... 427/585; 427/122; 427/228; 427/237; 427/238; 427/249; 427/294; 427/591
[58] Field of Search ................................. 427/591, 228, 427/237, 238, 249, 294, 122, 585

[56] References Cited

FOREIGN PATENT DOCUMENTS 2225396  11/1974  France .

OTHER PUBLICATIONS

Kotlensky, "A Review of CVO Carbon Infiltration of Porous Substrates", *16th National SAMPE Symp.*, pp. 257–265.14, 21 Apr. 1971.

*Primary Examiner*—Bernard Pianalto
*Attorney, Agent, or Firm*—Weingarten, Schurgin, Gagnebin & Hayes LLP

[57] ABSTRACT

The substrate (10) is placed in an enclosure (12) and is heated so as to establish therein a temperature gradient such that the substrate has a higher temperature in portions that are remote from its exposed surfaces than at its exposed surfaces. A reaction gas constituting a precursor for the material to be infiltrated is admitted into the enclosure, with formation of the material being enhanced in those portions of the substrate that are at higher temperature. At the beginning of the infiltration process, and at least during the major portion thereof, substrate heating is controlled in such a manner as to maintain the temperature of its exposed surfaces at a value that is no greater than the minimum temperature for the reaction gas to deposit the material that is to be infiltrated, while portions of the substrate that are remote from its exposed surfaces are at a temperature that is greater than the minimum temperature for deposition.

7 Claims, 2 Drawing Sheets

VAPOR PHASE CHEMICAL INFILTRATION PROCESS OF A MATERIAL INTO A POROUS SUBSTRATE AT CONTROLLED SURFACE TEMPERATURE

The invention relates to a chemical vapor infiltration (CVI) method of infiltrating a material into a porous substrate.

The field of application of the invention is in particular that of manufacturing pieces made of composite material comprising a fibrous substrate or "preform" that has been densified by a matrix. In this application, chemical vapor infiltration is used to form a deposit of the matrix-constituting material on the fibers of the substrate and throughout the volume thereof, in order to bond the fibers together and fill in the pores initially accessible in the substrate. Chemical vapor infiltration may also be used to finish off densification performed in part by some other method, e.g. using a liquid process in which the substrate is impregnated with a liquid precursor for the matrix-constituting material, and then the precursor is transformed, generally by heat treatment.

To perform chemical vapor infiltration, the fibrous substrate is placed in an enclosure. A reaction gas is admitted into the enclosure. Under determined conditions of temperature and pressure, the gas diffuses within the substrate and forms the deposit of matrix material by means of the components of the gas decomposing or reacting on making contact with the fibers.

The composition of the gas is selected as a function of the matrix to be made. CVI methods are well known for forming matrices out of pyrolytic carbon or "pyrocarbon", or out of ceramic, e.g. silicon carbide, boron nitride, or refractory oxides.

Several types of CVI method are in existence: the constant temperature and pressure method, the pressure gradient method, and the temperature gradient method.

In the constant temperature and pressure method, the substrate to be densified is placed in an isothermal enclosure. Heating is provided, e.g. by means of a graphite susceptor or core surrounding the enclosure and itself surrounded by an induction winding. Energy is applied to the substrate essentially by radiation from the enclosure. The temperature inside the enclosure is regulated to the desired value by controlling the current in the winding, while the pressure is adjusted by connecting the enclosure to a vacuum source and controlling the rate at which the gas is admitted into the enclosure. Matrix material is deposited inside the substrate and on the surface thereof. The temperature and pressure are selected to have values that are only slightly greater than those required for a deposit to form, so as to avoid massive deposition on the surface of the substrate occurring immediately on contact with the gas, since that would quickly lead to the surface pores being shut off, thereby preventing densification taking place within the substrate.

Nevertheless, it is inevitable that the surface pores will be closed progressively, thereby stopping the densification process before it is complete within the core of the substrate. It is then necessary to remove surface crust by machining so as to reopen the array of pores and continue densification. Several intermediate crust-removal operations may be necessary on a single piece prior to achieving the desired degree of densification.

By accurately controlling infiltration conditions, that method makes it possible to obtain a matrix of desired quality, and to do so in reproducible manner. It also has the major advantage of enabling a plurality of pieces of various shapes to be densified simultaneously within the same enclosure.

In spite of these advantages which justify its use on an industrial scale, the constant temperature and pressure method suffers from drawbacks of lengthy duration and large cost, in particular when manufacturing composite pieces of great thickness. Densification requires deposition to take place slowly, and thus requires cycles of long duration. In addition, the intermediate machining operations for crust removal give rise to losses of material and contribute to increasing cost price, with alternation between infiltration and crust removal lengthening the total duration of manufacture and increasing its cost. Finally, in particular for pieces of great thickness, it is inevitable that a considerable densification gradient remains within a given piece, with the degree of densification being significantly less deep within the piece than at its surface.

The pressure gradient method uses a forced flow of the gas through the preform. The forced flow gives rise to a pressure difference across the piece.

In addition to requiring the gas transport system to be specially adapted, the pressure gradient method suffers from one of the same limitations as the constant temperature and pressure method. The permeability of the pores to the gas decreases rapidly with more deposit being formed on the side facing the gas inlet. It is necessary to remove crust therefrom periodically in order to enable densification to continue.

In addition, that method is applicable only to substrates of shapes that are particularly simple and limited, with each piece requiring a special gas feed and circulation device.

The temperature gradient method consists in performing non-uniform heating of the substrate so that its temperature in the vicinity of its exposed surface is lower than its inside temperature remote from the surface. Since the deposition reaction is thermally activated, deposition speed or matrix growth increases with temperature. As a result, more densification takes place in the hotter portions within the substrate than in the cooler portions at the exposed surface of the operations. This is the type of infiltration method to which the present invention relates.

A CVI device using a temperature gradient was presented and described by W. V. Kotlensky to the "16th National SAMPE Symposium, Anaheim, Calif., Apr. 21–23, 1971" under the title "A review of CVD carbon infiltration of porous substrates", p. 257–265, and in a work entitled "Chemistry and physics of carbon", published in the United States of America by P. L. Walker, Vol. 9, pp. 198–199.

The substrate to be densified is applied via an internal face against a graphite core. The substrate and the core are housed inside an enclosure. An induction winding surrounds the enclosure. Gas is admitted via the base of the enclosure and it flows upwards.

The core is heated by electromagnetic coupling with the winding, and it in turn heats the substrate with which it is in contact. A temperature gradient is established through the substrate between the inside face in contact with the core and the exposed outside face where a lower temperature is established because of heat losses by radiation and by convection due to the circulating gas.

The magnitude of the temperature gradient is a function of the thermal conductivity of the substrate. If reference is made to page 260, column 2, of the above-mentioned article by W. V. Kotlensky, the temperatures given are as follows, for the core about 1500° C. and 1650° C., and for the gradient, respectively about 510° C. and 565° C. This results in a substrate surface temperature of about 990° C. or 1085° C. This temperature is well above the minimum temperature required for pyrolytic carbon to be deposited from methane or other hydrocarbons which constitute the carbon precursors envisaged in that article. It should also be observed that the same passage of that article indicates that the substrate itself is not directly heated by induction because of its low density and its poor coupling with the induction winding.

Another CVI technique using a temperature gradient has been described by J. J. Gebhardt et al. in an article entitled "Formation of carbon-carbon composite materials by pyrolytic infiltration", published in Petroleum derived carbons ACS Series No. 21 6/73.

In that case, the substrate to be densified is constituted by bundles of intermeshed graphite fibers oriented in seven different directions. The substrate is suspended inside an enclosure with the gas being admitted through the base thereof. The graphite fibers conduct electricity sufficiently to enable the substrate to be heated by direct coupling with an induction winding surrounding the enclosure.

The hottest zone of the substrate is situated inside the substrate, since its outside surface is cooled by radiation and by the upward flow of gas through the enclosure. A temperature gradient of a few °C. per centimeter is obtained going away from the internal portion which is the hottest.

In order to maintain a sufficient temperature gradient, the gas circulates at high speed so as to cool the surface, and the induction winding is restricted to a few turns in order to heat a limited zone of the substrate, such that a temperature gradient is also established between the portion of the substrate situated in the induction field and the portion of the substrate lying outside the field. Densification of the entire substrate is obtained by moving the substrate within the enclosure, parallel to the axis of the winding. These constraints mean that the method can be of limited use only, since it is difficult to industrialize.

An object of the present invention is to provide a CVI method of infiltrating pyrolytic carbon into a porous substrate in which a temperature gradient has been established. A particular object of the invention is to further improve the effect of the temperature gradient whereby pyrolytic carbon deposition is enhanced in the internal portions of the substrate remote from the exposed surfaces thereof.

According to the invention, this object is achieved by means of a method, in which, at the beginning of the infiltration process and at least during the major portion thereof, substrate heating is controlled in such a manner as to maintain the temperature of the exposed surfaces of the substrate at a value that is no greater than the minimum temperature for the reaction gas to deposit the material that is to be infiltrated, while the portions of the substrate that are remote from its exposed surfaces are at a temperature that is greater than the minimum deposition temperature.

The substrate may be heated by contact between a surface of the substrate and a heated body, such that a temperature gradient is established within the substrate between its surface in contact with the heated body and its exposed surfaces. The heated body may be constituted by the core, e.g. a graphite core, being electromagnetically coupled to an induction winding situated outside the enclosure.

When the substrate is made of electrically conductive material, it is possible to heat the substrate by direct electromagnetic coupling with an induction winding situated outside the enclosure.

The surface temperature of the substrate is controlled, for example, by measuring the temperature of an exposed surface by means of a sensor and by controlling the heating so as to regulate the measured temperature to a desired value. When the heating is produced by induction, heating control is achieved by controlling the current flowing through the induction winding.

As mentioned above, during the CVI process, deposition of infiltrated material results from the gas decomposing or from one of its components decomposing, or from a reaction between the components of the gas.

Deposition is a thermally-activated process, with deposition speed increasing with temperature.

For a given reaction gas, there exists a minimum temperature above which deposition begins to take place. This minimum deposition temperature may be a function of the pressure within the enclosure.

As an indication, for depositing pyrolytic carbon from a gas containing propane, the minimum temperature for deposition is equal to about 870° C.

To deposit silicon carbide from a gas comprising methyltricholorosilane (MTS) and hydrogen, the minimum deposition temperature is equal to about 700° C.

Controlling the surface temperature of the substrate so that it does not exceed the minimum temperature for deposition favors densification within the substrate. Such control prevents a surface deposit being formed too quickly since such a deposit could shut off the pores and prevent densification taking place deep within the substrate. In addition, the existence of the temperature gradient means that the portions of the substrate remote from its exposed surfaces are at a temperature that is higher than the minimum temperature required for deposition so deposition takes place preferentially within the substrate.

During the infiltration process, substrate densification advances towards the exposed surfaces. Towards the end of the densification process, the risk of densification deep within the substrate being prevented by premature shutting off of the pores in the surface becomes attenuated. That is why it is possible to envisage keeping the surface of the substrate at a temperature no greater than the minimum temperature required for deposition at the beginning of the infiltration process and during the major portion thereof, while nevertheless terminating densification by raising the temperature of the substrate surface to a value that is slightly greater than the minimum temperature required for deposition.

Implementations of the method of the invention are described below by way of non-limiting indication.

BRIEF DESCRIPTION OF THE DRAWINGS

Reference is made to the accompanying drawings, in which.

Figure 1:
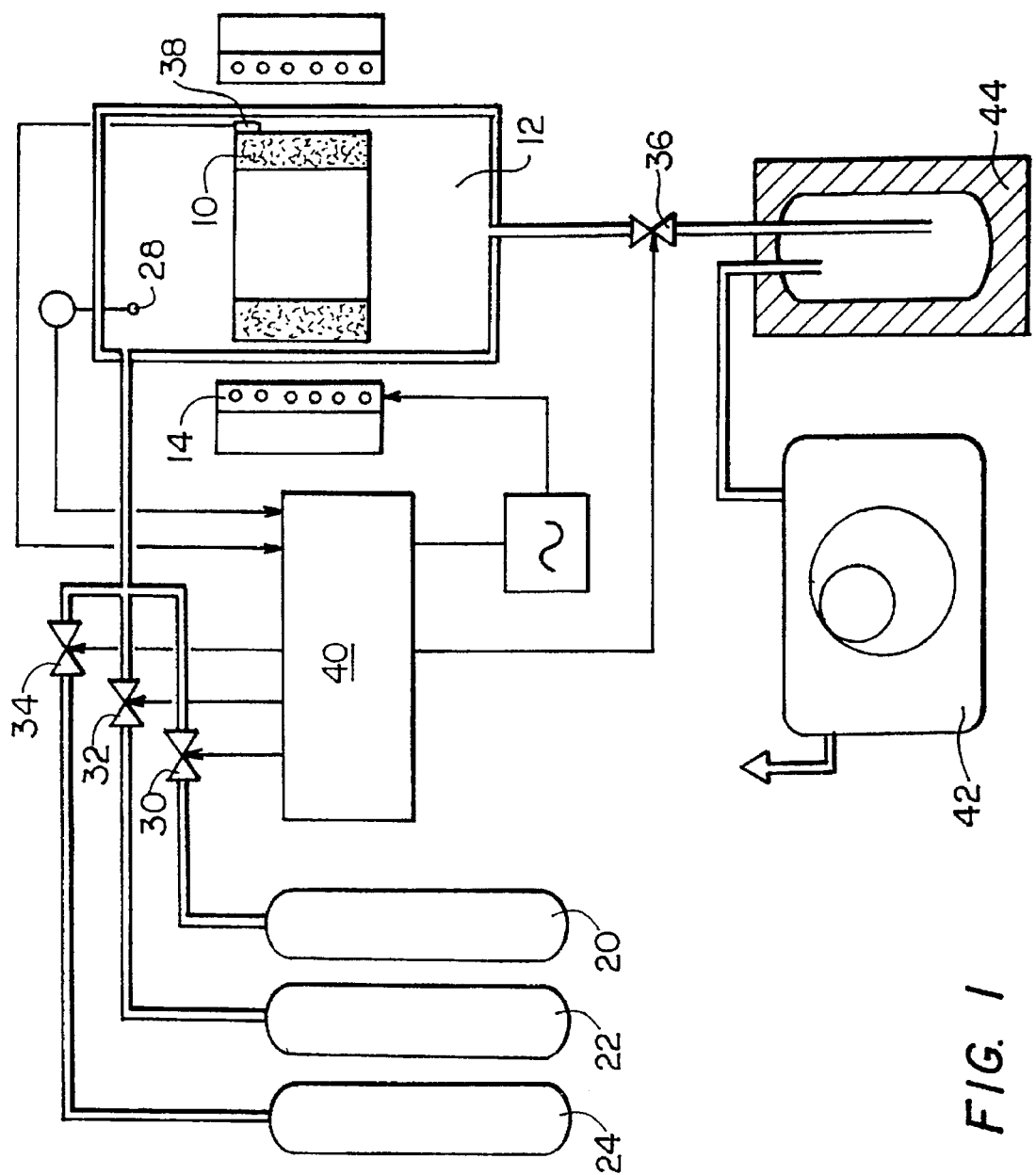
FIG. 1 is a highly diagrammatic view of an installation enabling the method of the invention to be implemented.

In the installation of FIG. 1, a substrate 10 to be densified is housed inside an enclosure 12. In this example, the substrate 10 is a fibrous structure in the form of an annular cylinder of rectangular meridional section. The substrate is heated by direct electromagnetic coupling from an induction winding 14 that surrounds the enclosure. The substrate 10 and the winding 14 are coaxial.

The winding 14 extends axially over a length that is equal to or greater than the length of the substrate 10 so that the substrate is located entirely within the electromagnetic field generated by the winding 14.

Gas suitable for forming the desired deposit on the fibers of the substrate 10 is admitted to the top portion of the enclosure 12. By way of example, the gas comprises a mixture of several gases taken from respective supplies such as cylinders 20, 22, 24 via respective injection valves 30, 32, and 34.

During the chemical vapor infiltration process, gaseous reaction products, including the residue from the reaction gases, are extracted from the bottom portion of the enclosure 12. Extraction is performed by opening a valve 36 putting the enclosure into communication with a vacuum pump 42 via a liquid nitrogen trap 44 that serves to retain undesirable gas species and to prevent them from being rejected to the ambient medium.

The valves 30, 32, 34, and 36 are controlled by a controller 40. The controller receives a signal produced by a sensor 28 and representative of the pressure inside the enclosure 12, and it controls the valve 36 so that a determined pressure obtains inside the enclosure 12 prior to admitting the gas.

The controller 40 also receives a signal delivered by a sensor 38 and representative of the temperature of the substrate 10 in the vicinity of one of its surfaces exposed to the flow of gas inside the enclosure. By way of example, the sensor 38 is a thermocouple placed in contact with the peripheral surface of the substrate 10.

The controller 40 controls the electrical current carried by the induction winding 14 so as to keep the temperature of the exposed surface of the substrate at a value that is no greater than the minimum temperature from which a deposit is obtained from the gas. This minimum temperature may be a function of the pressure inside the enclosure. The controller 40 is then advantageously programmed to determine the reference value for the surface temperature of the substrate as a function of the pressure measured by the sensor 28 and as a function of the gas mix. The temperature $T_S$ of the exposed surface of the substrate is preferably regulated to a value such that $T_D-50°$ C.$\leq T_S \leq T_D$, where $T_D$ is the minimum temperature for deposition to take place.

The substrate 10 is made of fibers that conduct electricity. It has characteristics of electrical resistivity and of thermal conductivity which make it suitable for being heated by direct coupling with the winding 14.

A type of structure that is particularly suitable for the substrate 10 is a needled structure of carbon or graphite fibers.

A method of making such a three-dimensional structure is described in document FR-A-2 584 107. The desirable characteristics of electrical resistivity and of thermal conductivity are given in the patent application filed by the present Applicant on the same day as the present application under the title "A CVI method of infiltrating a material into a fibrous substrate with a temperature gradient being established therein" and to which reference is made explicitly. To sum up, the radial electrical resistivity lies preferably in the range 1 mΩ/cm to 10 mΩ/cm, and the ratio of radial electrical resistivity over circumferential electrical resistivity is preferably equal to not less than 1.3, while the radial thermal conductivity preferably lies in the range 0.1 W/m°K to 20 W/m°K and the ratio between radial thermal conductivity and circumferential thermal conductivity is preferably no greater than 0.9. The above characteristics can be achieved with a fiber volume ratio, i.e. the apparent volume percentage of the substrate that is indeed occupied by the fibers, equal to not less than 20%.

Induction heating of the substrate is produced by the Joule effect by the currents that are induced. It is well known that such currents concentrate in the surface (the skin effect). That phenomenon of concentration in the surface is more marked with increasing frequency of the current powering the induction winding.

In spite of the skin effect, by selecting an appropriate frequency while taking account of surface cooling of the substrate due to radiation and convection (flow of the gas), it is possible to obtain a temperature gradient within the substrate.

Clearly the most appropriate frequency depends on several parameters: the kind of fibers from which the substrate is made up, the thickness of the substrate, its electrical resistivity and thermal conductivity, . . .

By way of indication, for a needled substrate of carbon fibers obtained in the manner described above, the optimum frequency lies in the range about 100 Hz to about 3000 Hz, depending on the fiber ratio and on the thickness of the substrate.

In the example shown in FIG. 1, the substrate 10 is in the form of a right circular cylinder. The method of the invention can be applied to substrates of other shapes, in particular to substrates of non-circular section or to non-cylindrical axially-symmetrical substrates, with the shape of the induction winding being adapted, where appropriate.

EXAMPLE

For the purpose of making a thruster nozzle throat, a piece of carbon-carbon composite material of annular cylindrical shape having an outside diameter of 1100 mm, a thickness of 130 mm, and a height of 100 mm, was made as follows:

A fibrous substrate or preform having dimensions corresponding to those of the piece to be made was built up from a two-dimensional fabric constituted by a cloth of preoxidized polyacrylonitrile (PAN) fibers constituting a precursor for carbon. The cloth was wound in superposed layers on a mandrel having a diameter corresponding to the inside diameter of the preform.

Each new layer was needled to the underlying fabric. For this purpose, a needle board was used that extended axially over a distance not less than the width of the plies, which width was equal to the height (100 mm) of the preform to be made. Needling was performed as winding took place, with each new layer being needled to constant depth equal to the thickness of several needled layers. When the desired thickness of preform had been achieved, 130 mm in this example, one or more finishing needling passes were performed in conventional manner to obtain constant density of needling throughout the preform. Needling was performed at a density enabling a fiber volume ratio of 28% to be obtained in the preform after heat treatment for transforming the preoxidized PAN into carbon. It should be observed that in conventional manner, needling was performed on fibers in the carbon precursor state since the effect of performing needling directly on carbon fibers is too destructive.

The preform was densified by a pyrolytic carbon matrix by means of an installation of the kind shown in FIG. 1. The pyrolytic carbon matrix was obtained from a gas comprising a mixture of methane and propane. The minimum deposition temperature $T_D$, in this case the temperature at which propane begins to decompose, was 870° C. for a pressure of 11 torrs inside the enclosure 12.

The preform was heated by direct electromagnetic coupling with the winding 14, the winding being powered by electricity at a frequency of 150 Hz. At least during the first stage of densification, the electrical current was controlled so as to maintain the temperature $T_S$ of the outside surface of the preform at a value such that $820°$ C.$\leq T_S \leq 870°$ C.

Initially, the electrical current was controlled so as to maintain the temperature of the outside surface of the wall of the preform at a value of about 830° C.

Figure 2:
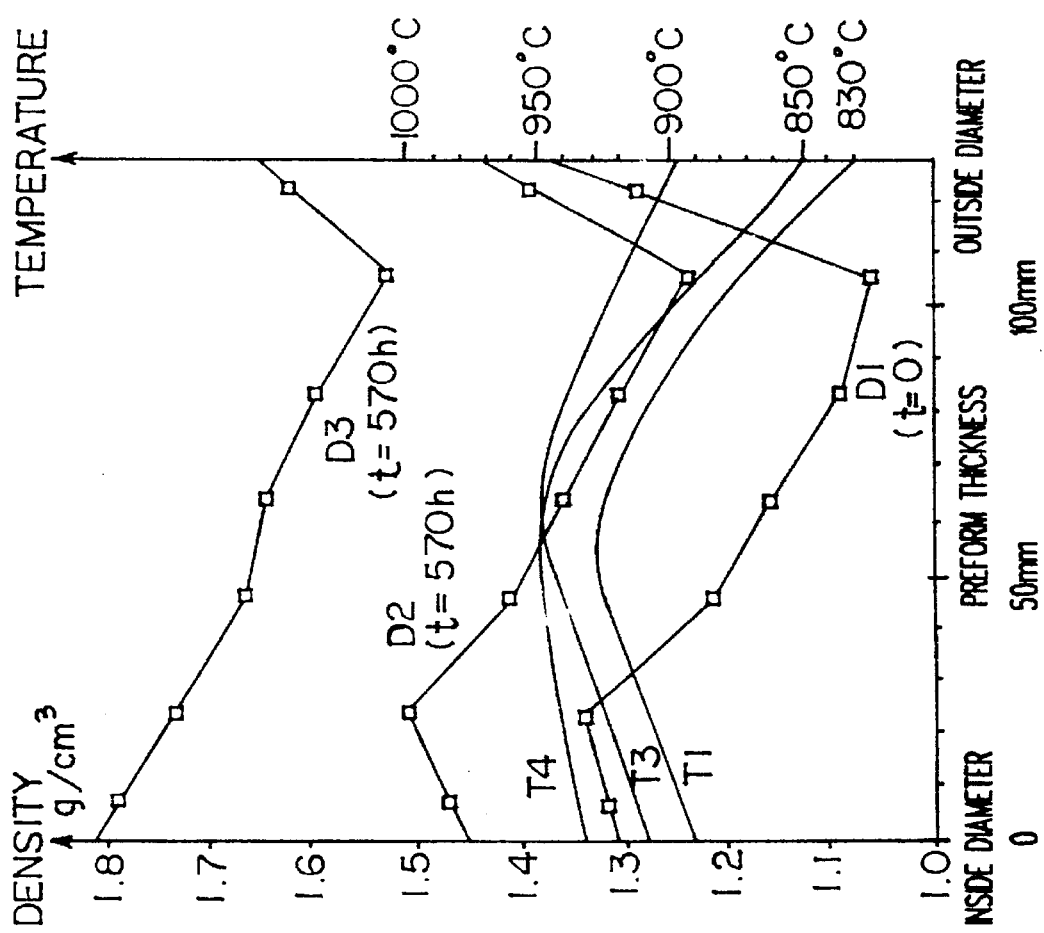
FIG. 2 a graph showing how the temperature gradient and the density gradient within a part being densified by a method of the invention vary over time.

The temperature distribution across the thickness of the preform (in the radial direction) was measured at the beginning of densification ($T_1=0$) as was the initial density distribution (in the radial direction) presented by said preform (curve T1, FIG. 2, and curve D1, FIG. 2).

Partial densification was then performed by regulating the temperature of the outside wall to the starting value for a time $t_2$ of 150 h. The resulting density distribution is given by curve D2.

Densification was then continued by applying temperature profile T3 (FIG. 2) while maintaining the temperature of the outside wall (on the outside diameter thereof) to a value varying over the range 850° C. to 900° C. After 400 h of densification, the profile T4 was obtained, and the density distribution D3 was measured. A mean density of 1.65 g/cm³ was measured on the composite part.

The method of the invention made it possible to obtain nearly uniform densification without any intermediate machining operation. The mean density of the resulting composite part was 1.65 g/cm³.

In the above example, the intention was to form the pyrolytic carbon matrix from a gas comprising a mixture of methane and propane. More generally, the carbon precursor in the gas may be constituted by at least one saturated hydrocarbon such as an alkane, an alkene, an alkyne, an alkyle, or a mixture thereof.

In addition, it is advantageous to use a gas that includes hydrogen in combination with the gaseous precursor of pyrolytic carbon.

As described in the patent application filed by the Applicant on the same day as the present application and entitled "A CVI method of infiltrating a pyrolytic carbon matrix within a porous substrate with a temperature gradient being established in the substrate", hydrogen has the property of inhibiting the reaction for depositing pyrolytic carbon at a temperature of less than about 1230° C., and of activating it for a temperature greater than about 1230° C. A temperature gradient is then established within the substrate such that the temperature of the hottest internal portions of the substrate are greater than 1230° C. while the temperature of the substrate portions close to the exposed surfaces is less than 1230° C. The effect of the temperature gradient on the speed with which pyrolytic carbon is deposited is then amplified by the hydrogen within the substrate while being attenuated thereby in the vicinity of the exposed surfaces. Hydrogen therefore contributes to obtaining uniform densification.

Figure 3:
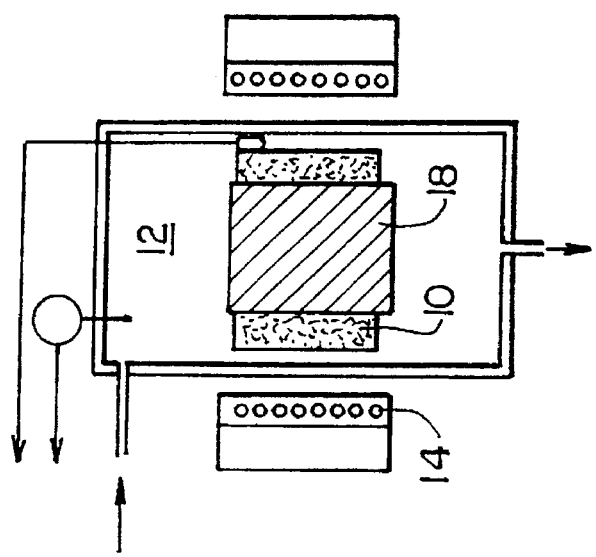
FIG. 3 is a highly diagrammatic fragmentary view showing a variant implementation of the method of the invention.

A variant implementation of the method of the invention is shown in FIG. 3 which is a fragmentary view of a CVI installation. Elements common to the implementations of FIGS. 1 and 3 are given the same references and are not described again.

The embodiment of FIG. 3 differs from that of FIG. 1 in that the substrate 10 is heated, not by direct coupling with the induction winding 14, but by contact with a solid graphite core 18 on which the annular substrate 10 is engaged.

Electromagnetic coupling takes place essentiality between the winding 14 and the core 18. A temperature gradient is established through the substrate 10 between its hotter inside surface in contact with the core 18 and its cooler exposed outside surface whose temperature is controlled.

This embodiment is particularly suited for substrates which naturally have characteristics such that it is not possible to envisage heating them by direct induction.

We claim:

1. A method for infiltrating a material into a porous substrate by chemical vapor infiltration, comprising the steps of:

placing the substrate in an enclosure;

heating the substrate in the enclosure by causing a current to flow through an induction winding located outside the enclosure, said heating being performed so as to create a temperature gradient within the substrate such that the temperature $T_S$ at an exposed surface of the substrate is lower than the temperature in portions of the substrate remote from said exposed surface;

admitting into said enclosure a reaction gas that includes a precursor for the material to be infiltrated, transformation of the precursor into said material being enhanced in portions of the substrate of higher temperature;

measuring the temperature of the substrate at the exposed surface; and controlling the current flowing through the induction winding at the beginning of the infiltration process and at least during the major portion thereof, in order to maintain the temperature at the exposed surface at a value which is no greater than a minimum deposition temperature required for said material to be formed, while temperature in portions of the substrate remote from the exposed surface is greater than said minimum deposition temperature.

2. The method as claimed in claim 1, wherein said temperature $T_S$ at an exposed surface of the substrate is maintained at a value such that $$T_D-50° C. \leq T_S \leq T_D,$$

where $T_D$ is said minimum deposition temperature.

3. The method as claimed in claim 1, wherein the substrate is heated by contact between a surface of the substrate and a susceptor which is induction coupled with said winding, the thermal gradient being created between the surface of the substrate in contact with the susceptor and an exposed surface.

4. The method as claimed in claim 1, comprising the admission in the enclosure of a reaction gas containing a carbon precursor in the form of at least one saturated or unsaturated hydrocarbon, and hydrogen, and the heating of the substrate to create a temperature gradient within the substrate on either side of a temperature of 1,230° C.

5. A method for infiltrating a material into a porous substrate by chemical vapor infiltration, comprising the steps of:

providing a substrate made of an electrically conductive material;

placing the substrate in an enclosure;

heating the substrate in the enclosure by causing a current to flow through an induction winding located outside the enclosure, and induction coupled directly with the substrate, said heating being performed so as to create a temperature gradient within the substrate such that the temperature $T_S$ at an exposed surface of the substrate is lower than the temperature in portions of the substrate remote from said exposed surface;

admitting into said enclosure a reaction gas that includes a precursor for the material to be infiltrated, transformation of the precursor into said material being enhanced in portions of the substrate of higher temperature;

measuring the temperature of the substrate at the exposed surface; and controlling the current flowing through the induction winding at the beginning of the infiltration process and at least during the major portion thereof, in order to maintain the temperature at the exposed surface at a value which is no greater than a minimum deposition temperature required for said material to be formed, while the temperature in portions of the substrate remote from the exposed surface is greater than said minimum deposition temperature.

6. The method as claimed in claim 5, wherein said temperature $T_S$ at an exposed surface of the substrate is maintained at a value such that $$T_D-50° C. \leqq T_S \leqq T_D,$$

where $T_D$ is said minimum deposition temperature.

7. The method as claimed in claim 5, comprising the admission in the enclosure of a reaction gas containing a carbon precursor in the form of at least one saturated or unsaturated hydrocarbon, and hydrogen, and the heating of the substrate to create a temperature gradient within the substrate on either side of a temperature of 1,230° C.

* * * * *